(12) United States Patent
Shan et al.

(10) Patent No.: US 9,960,329 B2
(45) Date of Patent: May 1, 2018

(54) LED PACKAGES USING HIGHLY REFLECTIVE DIE ATTACH MATERIAL AND ENHANCED REFLECTIVE SUBSTRATES

(71) Applicant: Luminus Inc., Sunnyvale, CA (US)

(72) Inventors: Qifeng Shan, Santa Clara, CA (US); Hongtao Ma, Campbell, CA (US); Tao Tong, Fremont, CA (US)

(73) Assignee: Luminus, Inc., Sunnyvale, CA (US)

( * ) Notice: Subject to any disclaimer, the term of this patent is extended or adjusted under 35 U.S.C. 154(b) by 0 days. days.

(21) Appl. No.: 14/832,665

(22) Filed: Aug. 21, 2015

(65) Prior Publication Data

US 2016/0056354 A1  Feb. 25, 2016

Related U.S. Application Data

(60) Provisional application No. 62/040,370, filed on Aug. 21, 2014.

(51) Int. Cl.
| | |
|---|---|
| *H01L 29/18* | (2006.01) |
| *H01L 33/60* | (2010.01) |
| *H01L 25/075* | (2006.01) |
| *H01L 33/64* | (2010.01) |
| *H01L 33/46* | (2010.01) |

(52) U.S. Cl.
CPC .......... *H01L 33/60* (2013.01); *H01L 25/0753* (2013.01); *H01L 33/46* (2013.01); *H01L 33/641* (2013.01); *H01L 33/642* (2013.01); *H01L 2924/0002* (2013.01); *H01L 2933/0025* (2013.01); *H01L 2933/0058* (2013.01); *H01L 2933/0075* (2013.01)

(58) Field of Classification Search
CPC ....................................................... H01L 29/18
See application file for complete search history.

(56) References Cited

U.S. PATENT DOCUMENTS

2011/0163348 A1* 7/2011 Lin ........................ H05K 1/021
257/99

* cited by examiner

*Primary Examiner* — Marvin Payen
(74) *Attorney, Agent, or Firm* — Wolf, Greenfield & Sacks, P.C.

(57) ABSTRACT

Methods and apparatus are provided to improve long-term reliability of LED packages using reflective opaque die attach (DA) material. In one novel aspect, a protected area surrounding edges of the LED is determined. The DA is applied to the determined protected area by a dispense process, a stamping process, or a screen printing process, such that the effect of temperature degradation is reduced. A heat distribution model is used to determine the protected area, which is between edges of the LED and a predefined isothermal line where the temperature is 1/e that of the temperature at edges of the LED. In another embodiment, the protected area is further based on a spreading ratio of the substrate size to the LED size. In another novel aspect, with multiple LEDs in the LED package, the spreading ratio is further based on pitch distances to the immediate adjacent LEDs and the substrate boundary.

10 Claims, 6 Drawing Sheets

LED PACKAGES USING HIGHLY REFLECTIVE DIE ATTACH MATERIAL AND ENHANCED REFLECTIVE SUBSTRATES

CROSS REFERENCE TO RELATED APPLICATIONS

This application claims priority under 35 U.S.C. § 119 from U.S. Provisional Application No. 62/040,370 entitled "RELIABLE LED PACKAGES USING HIGHLY REFLECTIVE DIE ATTACH MATERIAL AND ENHANCED AG SUBSTRATES," filed on Aug. 21, 2014, the subject matter of which is incorporated herein by reference.

TECHNICAL FIELD

The present invention relates generally to light-emitting diodes (LEDs) and, more particularly, to LED packages using highly reflective die attach material and enhanced reflective substrates.

BACKGROUND INFORMATION

Development in light-emitting diode (LED) lighting technology continues to take place at a dramatic pace. With improved brightness, lower energy consumption and longer life spans, the global market for LED lighting has grown exponentially. The rapid adoption of LED lighting in the commercial and residential markets requires further improvements in LED efficiency and quality. One of the important measurements for LED lighting is its long-term reliability, especially for high power LEDs, which operate under stringent condition and long hours.

To improve efficiency of the LED, highly reflective substrates are widely used for high performance LED packages and modules, especially in chip-on-board (COB) LED packages. However, the highly reflective substrate suffers from long-term reliability issues that reduce the life span of the LED device. For example, silver (Ag) is widely used in package substrates due to its high reflection. Traditionally, Ag is plated on a substrate such as an aluminum sheet. The plated Ag offers high reflectivity and improves the efficiency of the LED. However, Ag is a material that can easily migrate, be oxidized, and thus tarnish during the operation. Moreover, the speed of degradation of Ag accelerates dramatically with higher temperature. In an LED device, LED chips are attached to the highly reflective layer. The LED chip is the light source as well as the heat source in the LED package. When in operation, the LED chip generates heat and raises the temperature of the reflective layer surrounds it. The closer to the LED chips, the higher temperate is the substrate of LED package, and the faster for the substrate to degrade.

To slow the silver layer degradation, there has been development in new technologies to protect the reflective layer of the LED package. However, all the protection techniques treat the whole substrate uniformly without considering different temperature distribution and its effects in different areas of the substrate and they require additional steps to protect the substrate. These new protection technologies although prolongs the life span of the LED package, they fail to extend protections to the vulnerable areas, resulting in limiting the overall life span of the LED package.

A design for an LED packaging is sought that improves its performance and long-term reliability.

SUMMARY

Methods and apparatus are provided to improve long-term reliability of LED packages using highly reflective die attach material and enhanced reflective substrates. In one novel aspect, a protected area on the substrate surrounding edges of the LED is determined. Highly reflective opaque die attach material (DA) is applied to the determined protected area such that the effect of the reflectivity degradation of the substrate caused by the LED is reduced. In one embodiment, the DA is made of silicone mixed with reflective particles, such as $T_iO_2$, $Zr_2O_3$, $Al_2O_3$, and $Z_nO$. In another embodiment, the DA is processed to cover the predetermined protected area. In one embodiment, a heat distribution model is used to determine the protected area. The protected area is between edges of the LED and a predefined isothermal line of a threshold temperature. The maximum protection area around the die is determined by modeling the thermal spreading of the substrate. The predefined isothermal line is based on the shape of the LED. In another embodiment, the protected area is further based on the ratio of the substrate size to the LED size. In one embodiment, the predefined isothermal line is circular when the ratio is larger than a predefined threshold ratio. In another embodiment, the predefined isothermal line is rectangle-shaped with rounded corners when the spreading ratio decreases below a predefined threshold ratio.

In another novel aspect, multiple LEDs are attached to a highly reflective substrate, using highly reflective opaque die attach material. A protected area is determined for each LED such that the effect of temperature degradation in each of protected area is reduced. In one embodiment, the protected area of each LED is determined based on the temperature distribution around each LED chip.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

The exponential market growth drives the rapid technology advancements in the LED industry. Current technology focuses on extend the life span of the highly reflective silver layer by applying additional protection layers to the entire substrate. Such methods, although, successfully protect the ordinary tarnish of the silver layer in general, they fail to consider the heat effects generated by LED chips, which accelerates the degradation in specific area surrounding the LED chips. Further, covering the entire substrate with protection layer defeats the purpose of using highly reflective substrates in LED packages since the reflective surfaces are all covered and protected. The growing demands for LED lighting requires further improvements for the long-term reliability of LED devices. The current invention uses temperature distribution models and applies protection to specific areas that is most vulnerable for fast degradation.

Figure 1:
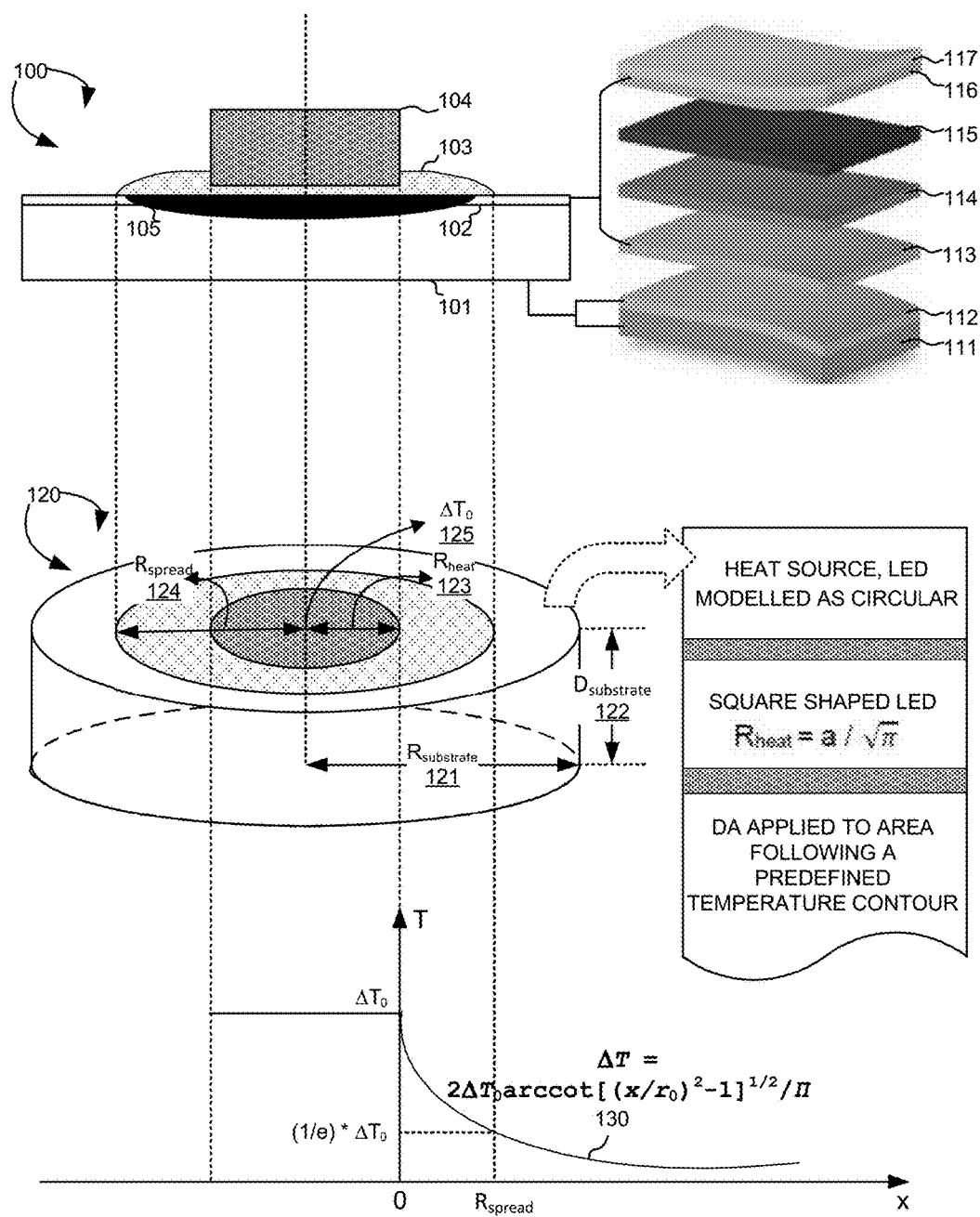
FIG. 1 is a perspective view of an LED assembly 100 and the heat distribution protection modeling in accordance with embodiments of the current invention.

FIG. 1 is a perspective view of an LED assembly 100 and its temperature distribution protection modeling in accordance with embodiments of the current invention. LED assembly 100 includes a substrate layer 101, a reflective layer 102, a die attach (DA) 103 and an LED 104.

Substrate layer 101 is a base metal layer. In one embodiment, substrate layer 101 is made of aluminum. A rectangle or square is cut from the roll of aluminum sheet metal on which a high refection mirror layer, reflective layer 102, is formed.

In one embodiment, highly reflective layer 102 includes a silver layer deposited over the entire substrate layer using physical vapor deposition (PVD) coating technique, for example sputtering. Unlike Ag plating used in traditional LED packaging, PVD coating provides better optical quality as well as improves the reliability of LED assembly 100. However, the long-term reliability of LED assembly 100 suffers because silver can easily migrated, be oxidized during normal operation. The life span of LED assembly 100 is shortened by the degradation of reflective layer 102. Many technologies have been used to enhance the performance and protect reflective layer 102.

In one embodiment, substrate layer 101 and reflective layer 102 further include multiple layers to extend protections to it from operation degradation. As shown in FIG. 1, substrate layer 101 further includes aluminum base layer 111 and specially treated aluminum layer 112. Reflective 102 layer includes a bonding layer 113, a PVD silver layer 114, a silver protection layer 115, and one or more protection and reflectance enhance layers 116 and 117. In one embodiment, PVD silver layer 114 is sputtered over bonding layer with 99.99% pure Ag. With the enhanced protection to reflective layer 102, the Ag is protected from normal oxidation and tarnish in regular temperature. However, the reflectivity over very long time (usually over several thousand hours) still cannot be maintained. The long-term reliability of the substrate is very important for the general lighting applications, which generally requires over 10,000 hours lifetime. The rate of tarnish for silver materials is strongly dependent on temperature. In general, LED chips are light sources as well as heat sources in LED packages. The heat dissipated over the substrate. Therefore, the closer to the LED chips, the higher temperature is the substrate, and thus the faster for substrate to degrade.

LED 104 is attached to highly reflective layer 102 through DA 103. In operation mode, LED 104 generates heat. LEDs are high-efficient light sources. However, LEDs are not 100% efficient and, thereby, generate heat. The heat causes the temperature of LED 104 to rise. Since highly reflective layer 102 and substrate 101 tarnish faster with higher temperature, over the time, a tarnished area 105 forms underneath and close to edges of LED 104 while other areas of the substrate do not degrade. Thereby, the life span of LED assembly 100 is limited by the durability of the areas surrounding edges of LED chips. In one novel aspect, DA 103 is extended to cover an area surrounding edges of LED 104 such that the overall life span of LED assembly 100 is extended.

DA 103 attaches LED 104 to highly reflective layer 102. In one embodiment, DA 103 is transparent polymers with reflective and thermally conductive particles, such as $T_iO_2$, $Zr_2O_3$, $Al_2O_3$, and $Z_nO$. Traditionally, DA 103 applies right underneath LED 104 to attach LED 104 to highly reflective layer 102. Over the time, tarnished area 105 due to higher temperature caused by LED 104 exposes surrounding edges of LED 104. The performance of LED assembly 100 is affected. In one novel aspect, as shown in FIG. 1, DA 103 is extended around tarnished area 105 to provide additional protection to highly reflective layer 102. In one embodiment, DA 103 is applied on the substrate with proper design near the edge of the die. In this embodiment, the size and shape of the protected area, where the DA is applied, is determined. Based on the determined protected area, an amount of DA is determined. The amount of DA applied is larger than applying DA regularly. The excessive amount of DA relative to the regular use is to be squeezed out during the die attaching process while the thermal resistance of the DA is kept the same. The squeezed-out DA, thereby, covers the determined protected area surrounding edges of the LED. For example, the fillet width, which is the distance of the edge of the DA to the edge of the LED, of the die attach materials can be ⅓ of the die size. In one embodiment, DA 103 is applied to the edge area using stamping process, screen printing or dispense process. By extending DA 103 to cover protected area surrounding edges of the LED chip, the degradation of the substrate near the LED chip will be blocked by the die attach material, and the lumen maintenance of the LED packages and modules will be improved by covering the Ag degradation area. By extending the reflective and opaque die attach material, LED assembly 100 can have both high performance and high reliability. The method can be also used in other applications such as LED modules that require performance as well as reliability.

In one novel aspect, the extended area covered by DA 103 is predetermined based on temperature contour on the substrate. The protection of most vulnerable area of the substrate prolongs the life span of LED assembly 100. The question remains how to determine the area to be covered by DA 103. In one novel aspect, a long-term temperature degradation model is used to determine the protection area where the DA should be further applied. A threshold temperature for a specific substrate can be used to define the protected area. For the highly reflective substrate with composite reflective layer as shown in FIG. 1, the threshold temperature can be between 90 degree Celsius and 150 degree Celsius depending on different material quality. In one embodiment, the threshold temperature is 120 degree Celsius.

FIG. 1 further shows a temperature distribution model 120 near LED 104. Based on the temperature distribution, a spreading area is determined. The spreading area surrounds edges of LED 104 where the high temperature generated by LED 104 worsens the tarnish of the substrate. Following temperature distribution model 120, DA 103 is applied to the determined spreading area. By applying the reflective die attach materials in the determined area light absorption from tarnishing substrates underneath or near the LED chip is avoided. In practice, the temperature distribution on substrates could be characterized using methods such as infrared imaging or thermal couple.

The substrate dimension can be much larger than that of an LED chip. A simplified model, assuming circular geometry for both LED and substrate, can be used to qualitatively estimate the spreading width of DA 103. The substrate is simplified to be a cylinder with a radius $R_{substrate}$ 121 and a thickness of $D_{substrate}$ 122. The heat source LED 104 is simplified to be a circular source with a radius of $R_{heat}$ 123. In this model, it is assumed that heat transfer is mainly through conduction through the substrate. When $R_{heat} \ll D_{substrate}$ the distribution of temperature increase over the reference temperature $\Delta T$ can be written as:

$$\Delta T = 2\Delta T_0 \text{arccot}[(X/r_0)^2 - 1]^{1/2}/\pi.$$

$\Delta T_0$ is the temperature increase underneath LED 104 over the reference temperature (i.e., temperature of the substrate far away from the LED). $r_0$ equals $R_{heat}$. X is the distance between the center of LED 104 and the measured point. $\Delta T_0$ is determined by the thermal resistance of the DA, which consisted of the contact thermal resistance and the thermal resistance of the material itself. The thermal resistance of the material mainly depends on the thickness of DA, which can be controlled during the process. Temperature contour can be, thereby, modelled using the temperature distribution model. In one novel aspect, the spreading area is defined as the area between edges of LED 104 and the isothermal line where the temperature is 1/e of $\Delta T_0$ (i.e., significant temperature drop). The spreading radius can be estimated as x to be around 1.83*$R_{heat}$. Based on the characteristic of the temperature distribution, further enhancements can be made for the die attaches to alleviate the degradation of the substrate near the LED mounting area. Such enhancements are based, at least in part, on different temperature distribution for different type of LED and different layouts.

FIG. 1 further shows a temperature distribution diagram 130 using the simplified model 120. Diagram 130 shows the temperature distribution over the distance from edges of LED 104. Underneath LED 104, the heat source LED 104 raises the temperature of the substrate to $\Delta T_0$. The temperature drops as moving away from edges of LED 104. The temperature distribution follows the model distribution equation for model 120. At distance $R_{spread}$, the temperature increase drops to be $((1/e)*\Delta T_0)$. When $X > R_{spread}$, the temperature raised by the heat source is smaller than $(1/e)$ of $\Delta T_0$. Thereby, the effect of the heat to the reflective layer is greatly reduced. The temperature in the area beyond $R_{spread}$ is much lower than that right underneath LED 104. Therefore, the area beyond $R_{spread}$ takes much longer time to degrade. Accordingly, DA 103 is only needed to apply to the spreading area.

Determining the spreading area and applying highly reflective opaque die attach to the spreading area alleviates the degradation effects in the area protected by the DA and therefore greatly prolongs the life span of LED packages. Defining spreading area for different shape of LED and in different LED package settings is important to optimize the protection.

Figure 2:
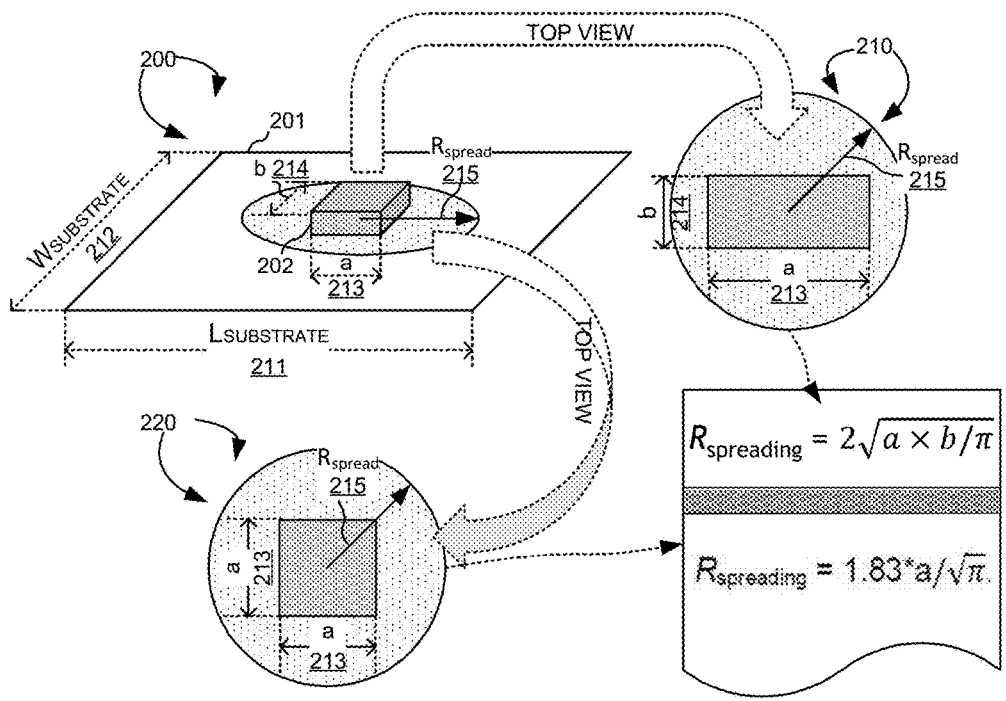
FIG. 2 shows exemplary calculations for temperature distribution of different types of LEDs.

FIG. 2 shows exemplary calculations for temperature distribution of different types of LEDs. An exemplary LED assembly 200 has a substrate 201 and an LED 202. Substrate 201 is modelled as a rectangle with sizes of $L_{substrate}$ 211 and $W_{substrate}$ 212. LED 202 is also modelled as a rectangle with sizes of a 213 and b 214. For rectangular or square shaped LED, as long as the substrate length is much larger than the LED and the two edges are close to each other the isothermal contour is close to circular shape.

A top view 210 of LED assembly 200 is shown. LED 202 with a length a 213 and a width b 214 has edge lengths close to each other. The isothermal line is close to a circular shape. Assuming $L_{substrate}$ 211 and $W_{substrate}$ 212 are much larger than length a 213 and width b 214, the isothermal line follows the temperature distribution model 120. In one novel aspect, a predefined isothermal line, which has a temperature increase dropped to 1/e of the temperature increase at edges of LED 202, is determined using temperature distribution model. Precise Isothermal contour can be also modeled using finite element analysis, where the problem domain is discretized and represented by an assembly of finite elements. In one embodiment, $R_{heat}$ is close to $\sqrt{\sqrt{v} \times \sqrt{v}}$.

A top view 220 of LED assembly 200 is also shown as a special case of when LED 202 is a square. LED 202 is a square with size of a 213. Because the edges are all equal, the isothermal line is a circular shape. Assuming $L_{substrate}$ 211 and $W_{substrate}$ 212 are much larger than size a 213, the isothermal line follows the temperature distribution model 120. In one novel aspect, a predefined isothermal line, which has a temperature increase dropped to 1/e of the temperature increase at edges of LED 202, is determined using temperature distribution model. Precise isothermal contour can be modeled using finite element analysis. In one embodiment, $R_{spreading}$ is close 1.83*a/$\sqrt{v}$.

Using the simplified model, the spreading area for an LED chip is determined. The highly reflective white die attach materials can be designed to cover the determined spreading area to provide needed protection. The life span of the LED package is prolonged with the additional protection by the DA.

Figure 3:
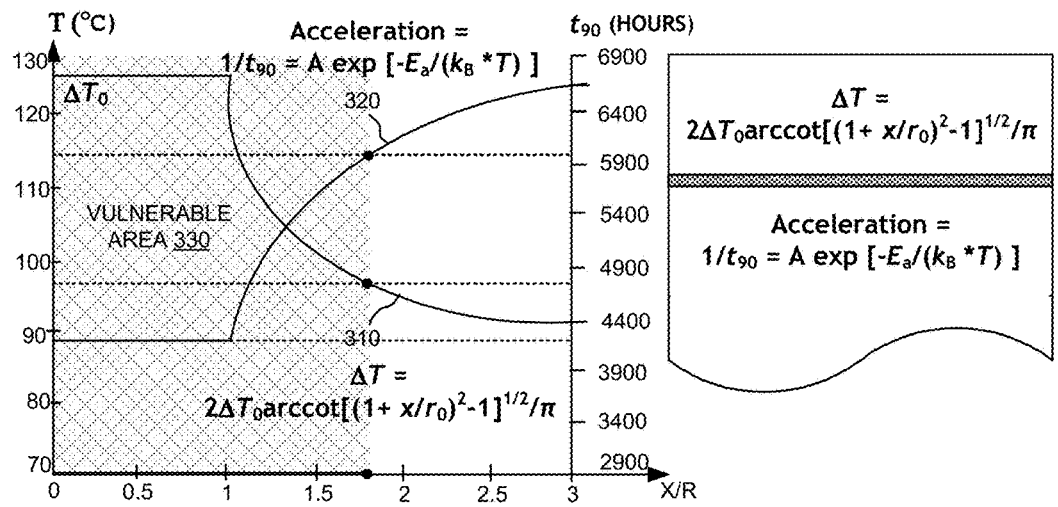
FIG. 3 shows exemplary diagrams of substrate degradation vs. distance from the LED edge.

FIG. 3 shows exemplary diagrams of substrate degradation vs. distance from the LED edge. Enhancements can be made to use highly reflective opaque die attaches based on the distance from the LED edge.

A substrate surface temperature distribution diagram 310 shows the temperature distribution with the distance from the LED edge. In a simplified model, diagram 310, similar to diagram 130, is expressed as:

$$\Delta T = 2*\Delta T_0*\text{arccot}[(x/r_0)^2 - 1]^{1/2}/\pi$$

$\Delta T_0$ is the temperature underneath LED and x is the distance from the edge of the LED. The x-axis is $x/r_0$, where $r_0$ is the radius of the heat source LED. As shown in diagram 310, the temperature decreases rapidly away from the edge of the LED chip. Therefore, when in operation, areas close to the edges of the LED chip have higher temperature causing the substrate Ag migration and darkening while the rest of the substrate operates under normal temperature with much longer life span. In one embodiment, it is determined that when the temperature drops to (1/e) of $\Delta T_0$, the temperature is low enough not to cause any significant effect on the tarnish process of the substrate. Thereby, according to the temperature model, a spreading length is determined using this temperature distribution diagram by finding the distance x when the temperature drops to (1/e) of $\Delta T_0$. It is noted that the principle of invention is to determine a protected area according to a temperature distribution model such that the protected area is covered with highly reflective opaque die attach material to protect it from temperature degradation. Thereby, depending on the overall system design, other values, instead of (1/e) can be used to determine the point that the temperature is low enough. Similarly, other temperature distribution model can be used. Further, calibration or measurements can be used to more precisely determine the temperature contour in different scenarios. Such process can be performed on sample LEDs in manufacturing settings or in isolated setting to obtain sample data. Once a temperature contour is generated, by theoretic modelling or sampling measurement or any other means, an isothermal line with a predefined temperature can be chosen to determine an isothermal contour area as the protected area. In one embodiment, the predefined temperature can be relative temperature to the heat source temperature $\Delta T_0$. In another embodiment the predefined temperature can be a predefined absolute temperature threshold. Although the absolute temperature is the factor that affects the lifespan of the substrate, in practice, the relative temperature to the reference temperature (such as the temperature at the bottom of a substrate) can be used to determine the protected area. For a practical LED package, substrate temperature (reference temperature) is supposed to be controlled at a recommended level (for example, 85$^\vee$C). For a reasonable thermal management, $\Delta T_0$ is supposed to be controlled at a reasonable level.

A substrate operating life vs. distance diagram 320 shows the substrate wear-out time with the distance from the LED edge. Reflectance of the substrate is the parameter used to measure the package lifetime if substrate is the fastest failing component. The light-output power (LOP) of a package (especially a package with loaded phosphor silicone dome) is strongly dependent on the substrate reflectance. When light is bouncing back and forth in the package due to scattering on the phosphor particle, the effect of reflectance becomes more significant. For single material degradation, such as Ag migration in the case of PVD Ag substrate for an LED package, empirical Arrhenius equation is generally used to describe the degradation rate:

$$\text{Acceleration} = 1/t_{90} = A \exp[-E_a/(k_B * T)]$$

$t_{90}$ is the time when the substrate reflectance drops to 90% of initial value. $k_B$ is the Boltzmann constant and T is temperature. A and $E_a$ are fitting parameters determined by reliability data. A is a dimensionless pre-factor and $E_a$ is an energy parameter (with unit of J) reflecting how sensitive of the materials on temperature. Using this acceleration diagram and the temperature distribution equation, the time for the substrate degrading to 90% of the initial reflectance can be determine. For example, diagram 320 shows that underneath the LED, where $X/R_{heat}<1$, the reflectance of substrate suffers large degradation with $t_{90}$ less than 4200 Hours. As the temperature drops when moving away from the heat source, $t_{90}$ increases. In one embodiment, a predefined $t_{90}$ is determined. A spreading length is determined accordingly using the degradation diagram or a degradation look up table in accordance with the diagram. For example, a predefined $t_{90}$ is determined to be 6000 Hours. Diagram 320 yields that when $X/R_{heat}>1.83$, $t_{90}$ reaches the minimum of 6000 Hours. Thereby, the spreading length is $1.83*R_{heat}$. Accordingly, a vulnerable area 330 shows the region of the substrate that would degrade faster due to higher temperature from the LED source. The temperature upper limit for longer lifetime varies depending on reflective material properties. The upper limit temperature can vary from 90° C. to 150° C. In one novel aspect, the vulnerable area, which is from the center of the LED to $1.83*R_{heat}$, is covered with DA. Due to opaque of the DA, the degraded area covered by the DA does not affect the performance of the LED package. Therefore, the life span of the whole LED package is prolonged to the targeted 6000 Hours even though the edge area around the LED starts to degrade after less than 4200 Hours. Among the many factors that affect the lifespan of the LED package, the degradation of the substrate is an important limiting factor. Once the substrate degradation occurs, the LOP of the LED package degrades. For example, when the reflectance degrades to 90% of the original value, the performance of the LED package drops considerably. Therefore, prolonging the lifetime of the substrate is important to extend the lifespan of the LED package.

Using the temperature distribution model, a spreading area or protected area can be determined. The reflective opaque DA is applied to the determined protected area such that it is protected from temperature degradation. In the foregoing models, the size of the substrate is assumed to be much larger than the size of the LED. Circular shapes are used for both the substrate and the LED to simplify the calculation. When the relative size of the substrate becomes smaller, the circular model is no longer accurate. In other embodiments of the current invention, other factors are considered. One of such factors is the ratio of the size of the substrate over the size of the LED. When the size ratio is large, for example, larger than a predefined ratio threshold, the circular models as shown in 130 is close to an accurate model. As size ratio becomes smaller, the thermal spreader is getting smaller and thereby the adiabatic at the boundary has more effect on the temperature distribution. In such settings, the spreading length is shortened. Further the shape of the isothermal line are not circular.

Figure 4:
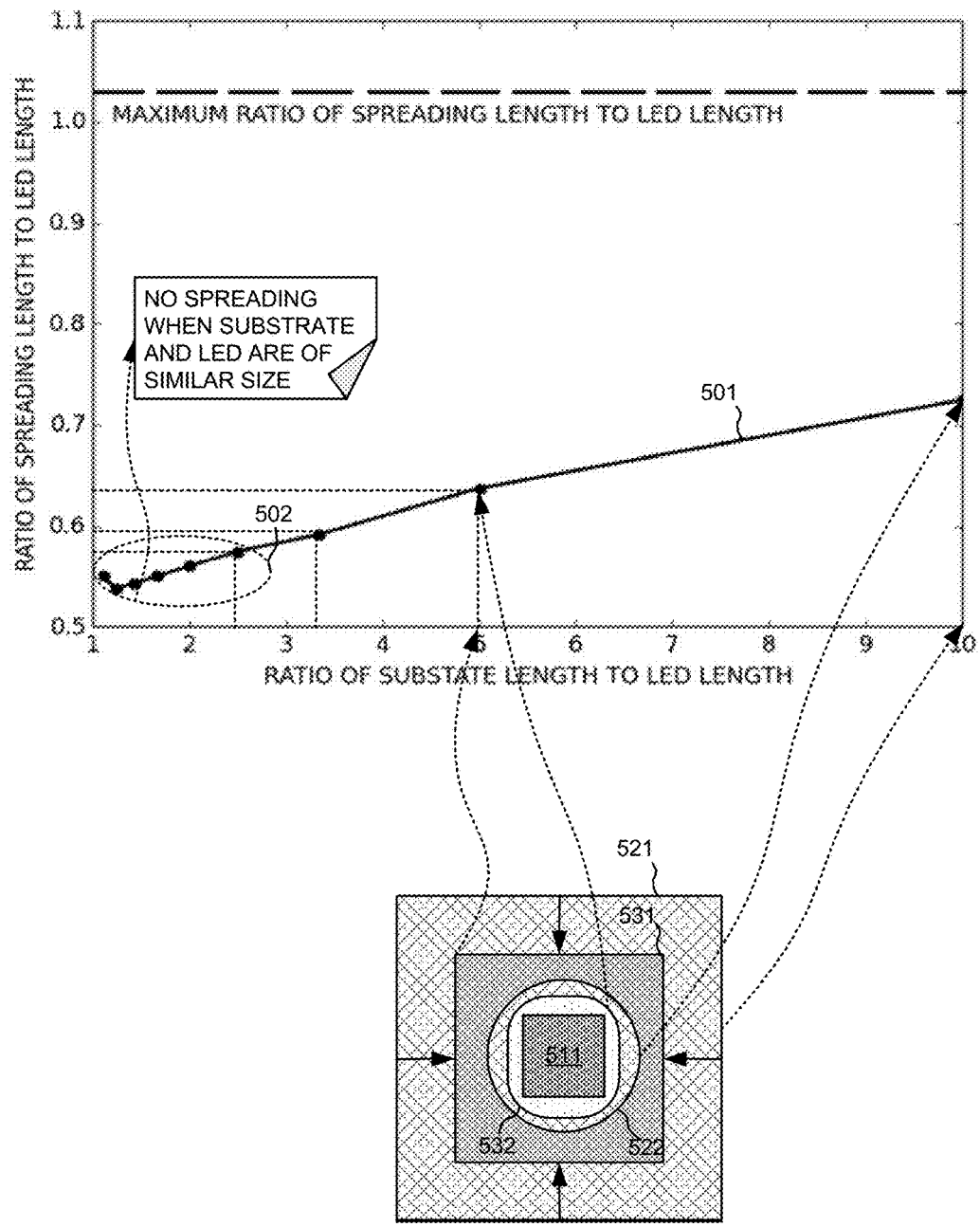
FIG. 4 shows an exemplary diagram of spreading length vs. substrate length and exemplary spreading areas in accordance with embodiments of the current invention.

FIG. 4 shows an exemplary diagram of spreading length vs. substrate length and exemplary spreading areas in accordance with embodiments of the current invention. The spreading length is defined as the distance of the point where the temperature increase ($\Delta T$) drops 1/e of that at the LED edge ($\Delta T_0$). The graph shows the spreading length vs. the substrate length. The x-axis of the graph is the ratio of substrate length to the LED length. The y-axis is the ratio of the spreading length to the LED length. The graph illustrates that when the size of the substrate and the size of the LED are similar, there is very little spreading. The diagram is based on the calculation results, which varies with different calculation parameter settings. However, the conclusion, which states that when size is smaller the spreading length is shorter still holds, draw from the analysis does not change. As shown on graph 501, a range 502 illustrates that when the size of the substrate and the size of the LED are similar, there is very little spreading. When the ratio of substrate length to the LED length increases to 10, the ratio of spreading length to the LED length equals to 0.73. Thereby, as the ratio of substrate length to the LED length increase, the circular model renders relatively accurate spreading area. In cases of the ratio of substrate length to the LED length is on the order of 1 (e.g., much smaller than 10), the circular model no longer accurately represents the spreading area formed by isothermal line. In such cases, the ratio of substrate length to the LED length or the ratio of the size of substrate and the size of the LED needs to be considered in determining the protected area for the LED.

FIG. 4 further illustrates the changes of the spreading or protected area when the size of the substrate changes. LED 511 is attached to a substrate 521. The ratio of length of substrate 521 to the length of LED 511 is ten. In accordance with graph 501, the ratio of the spreading length to LED length equals to around 0.73. The spreading area is enclosed by a circular isothermal line 522 with a radius about 0.73 times of the size of LED 511. If LED 511 is attached to substrate 531, the size and shape of the spreading changes.

Assuming the ratio of length of substrate 531 to the length of the LED is five, in accordance to graph 501, the ratio of the spreading length to the LED length equals to around 0.64. The shape of the isothermal line 532 is no longer circular. Isothermal line 532 becomes more square-like with rounded corners. The spreading area for substrate 531 is enclosed by isothermal line 532.

The ratio of the substrate size to the LED size is an important factor affecting temperature contour on the substrate, especially when the ratio is small. The size of the substrate plays a bigger role as the ratio decreases. In one embodiment, the ratio of substrate size to the LED size is considered in determining the protected area surrounding the LED that DA is applied.

Figure 5:
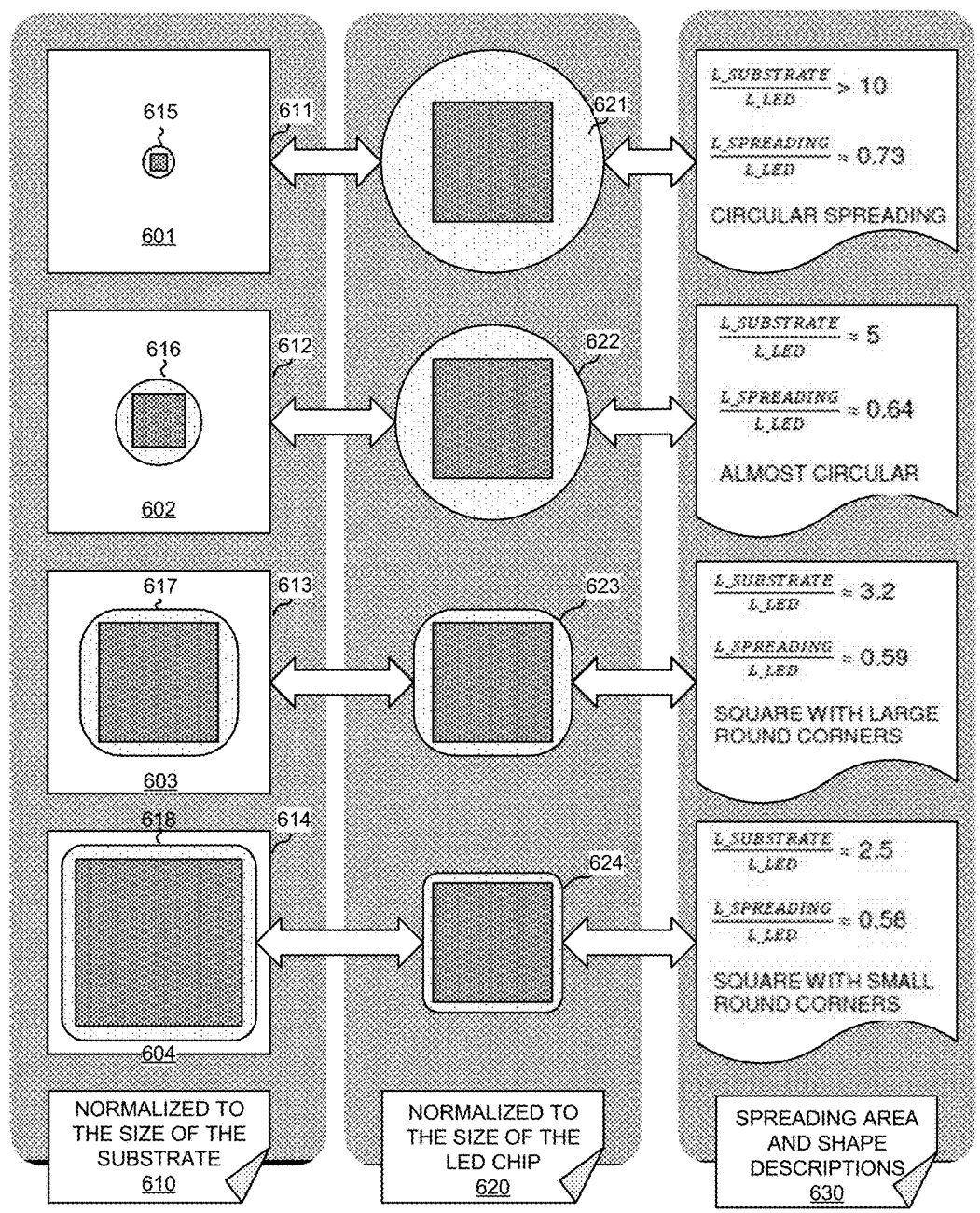
FIG. 5 illustrates spreading area with different ratio of substrate size to LED size in accordance with embodiments of the current invention.

FIG. 5 illustrates different perspective of spreading area with different ratio of substrate size to LED size in accordance with embodiments of the current invention. Different perspective of spreading/protected area are shown to illustrate optimized spreading/protected area by further considering the ratio of substrate size to LED size. A group 610 shows exemplary perspective views of different ratios of substrate size to LED size and each perspective view is normalized to the size of the substrate. The exemplary diagrams in group 610 illustrate configuration with the same substrate size with different LED sizes. The size and shape of the spreading/protected area is shown accordingly. Corresponding to each exemplary perspective views in group 610, a group 620 shows the corresponding perspective views, which are normalized to the size of the LED. The exemplary diagrams in group 620 illustrate configuration with the same substrate size with different LED sizes. Corresponding to each exemplary configuration in group 610, the size and shape of the spreading/protected area is shown accordingly. A group 630 provides configuration data to their corresponding diagrams in group 610 and group 620.

Group 620 shows the corresponding perspective views, which are normalized to the size of the LED. LED 601 has a substrate 611 and a LED chip 615. The ratio of substrate length 611 to LED chip 615 length is greater than or equals to ten. A corresponding spreading area 621 is shown in group 620 with the normalized size for LED chips. Spreading area 621 is encompassed by the predefined isothermal line. In one embodiment, the predefined isothermal line is where the temperature increase equals to (1/e) of the temperature increase at edges of the LED chip. Since the ratio of substrate length to the LED length is large enough the shape of the predefined isothermal line is circular, with the radius equals to about 0.73 times that of the length of the LED 615.

As the ratio of the substrate length to LED chip length decreases, the shape and size of the predefined isothermal line changes, resulting in different protected area. LED 602 has a substrate 612 and a LED chip 616. The ratio of substrate length 612 to LED chip 616 length equals to about five. A corresponding spreading area 622 is shown in group 620 with the normalized size for LED chips. Spreading area 622 is encompassed by the predefined isothermal line, which is normally the isothermal line where the temperature increase equals to (1/e) of the temperature increase at edges of the LED chip.

As the ratio the substrate length to LED chip length continues to decrease, the shape of protected area evolves from circular or almost circular to almost square shape, or rectangle shape in the cases when the LED chip is rectangle-shaped. LED 603 has a substrate 613 and a LED chip 617. The ratio of substrate length 613 to LED chip 617 length equals to about 3.2. A corresponding spreading area 623 is shown in group 620 with the normalized size for LED chips. Spreading area 623 is encompassed by the predefined isothermal line, which is normally the isothermal line where the temperature equals to (1/e) of the temperature at edges of the LED chip. Since the ratio of substrate length to the LED length decreases the shape of the predefined isothermal line changes to almost square with large round corners, with the half length of the spreading area equals to about 0.59 times that of the length of the LED 617.

When the substrate length is similar to the LED length, the spreading area becomes more of a square with smaller spreading length. LED 604 has a substrate 614 and a LED chip 618. The ratio of substrate length 614 to LED chip 618 length equals to about 2.5. A corresponding spreading area 624 is shown in group 620 with the normalized size for LED chips. Spreading area 624 is encompassed by the predefined isothermal line, which is normally the isothermal line where the temperature equals to (1/e) of the temperature at edges of the LED chip. Since the ratio of substrate length to the LED length decreases further, the shape of the predefined isothermal line changes to almost square with small round corners, with the half length of the spreading area equals to about 0.58 times that of the half length of the LED 618.

As illustrated above, the ratio of the substrate size to the LED size is an important factor in determining the protected area surrounding the LED chip, especially when the ratio is small. In one novel aspect, the spreading area/protected area is not only affected by the substrate size, but also limited by the distance from other LED chips on the same substrate.

Figure 6:
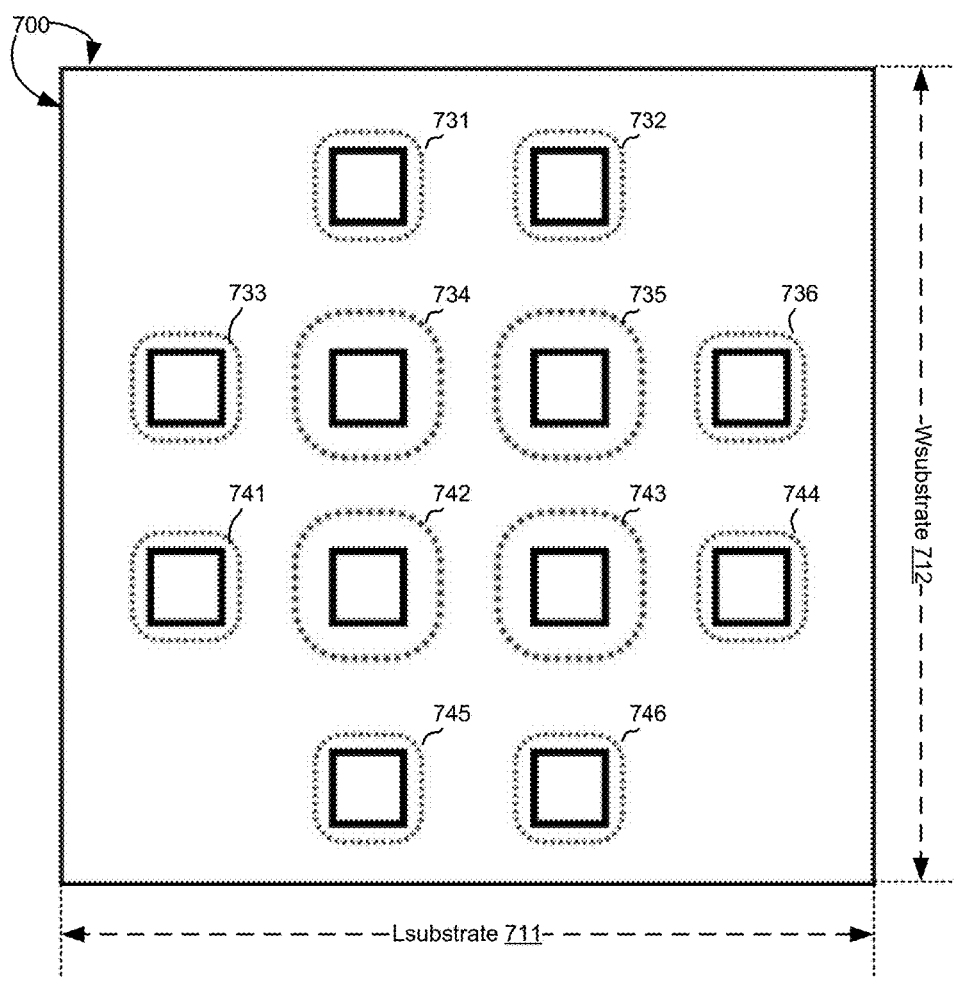
FIG. 6 illustrates spreading area limited by multiple LEDs in accordance to embodiments of the current invention.

FIG. 6 illustrates spreading area limited by multiple LEDs in accordance to embodiments of the current invention. A LED package 700 includes a substrate with a length 711 of $L_{substrate}$ and a width 712 of $W_{substrate}$. For LED packages, the temperature distribution around the LED depends on the LED around it as well. Therefore, the DA needs to cover a wider area when the LED is surrounded by other close-by LEDs. As shown, LEDs 731 to 736 and 741 to 746 are LEDs in a LED package. LEDs 731, 732, 733, 741, 736, 744, 74 and 746 are at the edge of the LED package, therefore, the absolute temperatures around these LED are lower than the ones at the center of the LED package, such as LEDs 734, 735, 742 and 743. Since the LEDs at the edge of the LED package have relatively lower temperature than the ones at the center of the LED package, the edge LEDs has smaller DA protected area than the center LEDs. In other embodiments, different LEDs layouts can be used. The protected area for LED is further determined by the layout of the LED package. The protected are is determined by the absolute temperature distribution around the each LED.

Figure 7:
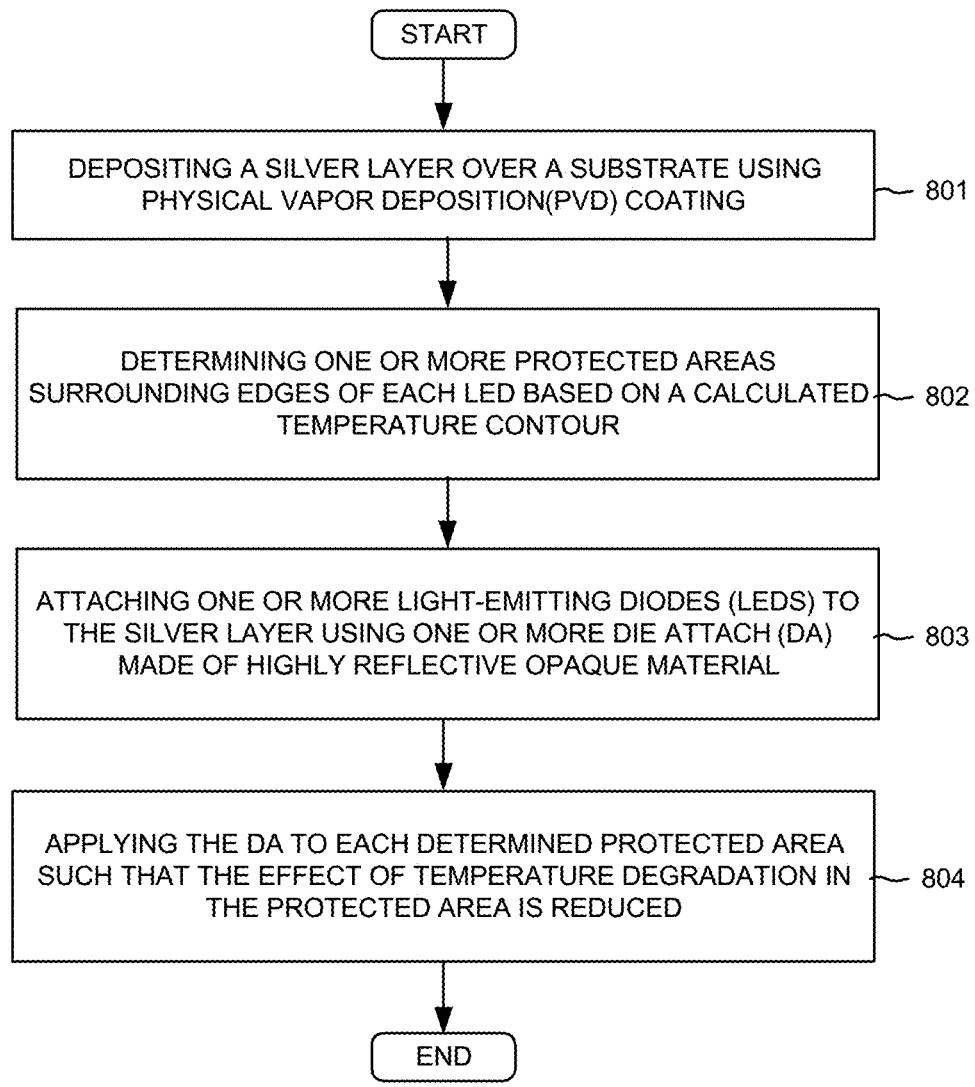
FIG. 7 is an exemplary flow chart for applying DA material to a determined protected area such that the LED package is protected from temperature degradation in accordance with embodiments of the current invention.

FIG. 7 is an exemplary flow chart for applying DA material to a determined protected area such the LED package is protected from temperature degradation in accordance with embodiments of the current invention. Step 801 deposits a silver layer over a substrate using physical vapor deposition (PVD) coating and deposit protection layers. Step 802 determines one or more protected areas surrounding edges of each LED based on a predefined temperature contour. Step 803 attaches one or more light-emitting diodes (LEDs) to the silver layer using one or more die attach (DA) made of highly reflective opaque material. Step 804 applies the DA to each determined protected area such that the protected area of each corresponding LED is protected from temperature degradation.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus, comprising:
a substrate having a top surface;
a composite reflective layer disposed over the top surface of the substrate using physical vapor deposition (PVD), wherein the silver layer has an upper surface; and
a die attach (DA) that attaches a light emitting diode (LED) device to the upper surface of the composite reflective layer, wherein the DA is made of highly reflective opaque material, and wherein the DA is further applied to a protected area underneath and surrounding edges of the LED based on a temperature contour such that the effect of reflectivity degradation in the protected area is reduced, wherein the protected area covers an area underneath the LED and between edges of the LED and an isothermal line.

2. The apparatus of claim 1, wherein the DA is made of silicone mixed with reflective particles.

3. The apparatus of claim 2, wherein the reflective particles is made of one selecting from the group consisting of $T_iO_2$, $Zr_2O_3$, $Al_2O_3$, and ZnO.

4. The apparatus of claim 1, wherein the DA is applied to the protected area by a process selecting from a group consisting of a dispense process, a stamping process and a screen printing process.

5. The apparatus of claim 1, wherein the predefined isothermal line is the isothermal line that the temperature increase to a reference temperature drops to lie of the temperature increase at the edge of the LED.

6. The apparatus of claim 1, wherein the predefined isothermal line is determined by the shape of the LED.

7. The apparatus of claim 1, wherein the predefined isothermal line is determined by a ratio of an area of the LED over an area of the substrate.

8. The apparatus of claim 1, wherein the shape of the LED is a rectangle with a length and a width of a and b, and wherein the upper limit of the predefined isothermal line is a circle centered at a center of the LED and with a radius of around $\sqrt{a \times b / \pi}$.

9. The apparatus of claim 1, wherein the shape of the LED is a square with a length of a, and wherein the upper limit of the predefined isothermal line is a circle centered at a center of the LED and with a radius of around 1.03a.

10. The apparatus of claim 1, further comprising:
a second DA made of highly reflective opaque material attaches a second LED to the upper surface of the silver layer, wherein the second DA is further applied in a second protected area surrounding the edge of the second LED based on a temperature contour measured or modeled such that the effect of temperature degradation in the second protected area is reduced.

* * * * *